United States Patent
Hsieh et al.

(10) Patent No.: US 6,287,967 B1
(45) Date of Patent: Sep. 11, 2001

(54) SELF-ALIGNED SILICIDE PROCESS

(75) Inventors: Kevin Hsieh, Hsinchu Hsien; Michael W C Huang, Taipei Hsien; Wen-Yi Hsieh, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/451,585

(22) Filed: Nov. 30, 1999

(51) Int. Cl.⁷ ..................................... H01L 29/76
(52) U.S. Cl. .................. 438/664; 438/141; 438/299; 438/648; 438/649; 438/663; 438/680; 438/681; 438/682; 438/683
(58) Field of Search ..................... 438/141, 299, 438/648, 649, 663, 664, 680, 681, 682, 683

(56) References Cited

U.S. PATENT DOCUMENTS 5,834,356 * 10/1998 Bothra et al. ................. 438/384
5,841,173 * 10/1998 Yamashita ....................... 257/384

* cited by examiner

Primary Examiner—Charles Bowers
Assistant Examiner—Lisa Kilday
(74) Attorney, Agent, or Firm—Jiawei Huang; J. C. Patents

(57) ABSTRACT

A self-aligned silicide process. A substrate has at least a transistor formed thereon. A thin metal layer is formed over the substrate. A first rapid thermal process is performed to make the metal layer react with polysilicon of the gate and of the source/drain regions to form a first metal silicide layer. The metal layer, which does not react with polysilicon, is removed. A selective raised salicide process is performed to form a second metal silicide layer on the first metal silicide layer. A second rapid thermal process is performed to transform the first metal silicide layer and the second metal silicide layer from a high-resistance $C_{49}$ phase into a low-resistance $C_{54}$ phase.

20 Claims, 2 Drawing Sheets

SELF-ALIGNED SILICIDE PROCESS

BACKGROUND OF THE INVENTION

1. Field of the Invention

The invention relates in general to the fabrication of semiconductor integrated circuits (ICs), and more particularly to a self-aligned silicide (salicide) process.

2. Description of the Related Art

At a deep sub-micron level of semiconductor fabrication technologies, line width, contact area, and junction depth are greatly reduced. In order to effectively enhance device performance, reduce device resistance, and reduce device resistance-capacitance (RC) delay, silicide has gradually taken the place of polysilicon in the formation of conductive parts, such as a gate or interconnects. The formation of a silicide layer has a self-aligned characteristic. Since silicide is formed by a reaction, the usual photolithography process is not necessary. This fabrication process to form a silicide is therefore called a self-aligned silicide (salicide) process. The silicide layer formed through the salicide process is usually called a salicide layer.

A silicide layer, usually, is formed by triggering a reaction between a metallic material and silicon of a substrate through a rapid thermal annealing. After reaction, a silicide material is therefore formed on a silicon interface of the substrate. The silicide material usually includes titanium silicide, tungsten silicide, cobalt silicide, nickel silicide, molybdenum silicide, or platinum silicide, in which titanium silicide is the most widely used because its conductivity is relative higher and it can be easily controlled in fabrication.

Salicide process forms silicide material on a gate electrode and on source/drain regions. The silicide material easily diffuses through source/drain regions to a substrate while forming the silicide material on the source/drain regions. It causes a junction leakage. The effect can be resolved by decreasing a thickness of the silicide material over the source/drain regions. However, thickness of the silicide material on the gate electrode decreasing does increase sheet resistance of the gate electrode.

Furthermore, titanium silicide is usually used for salicide process. Titanium silicide comprises $C_{49}$ phase and $C_{54}$ phase. The $C_{49}$ phase titanium silicide has a higher resistance than the $C_{54}$ phase titanium silicide. The $C_{49}$ phase titanium silicide can grow at a lower temperature than the $C_{54}$ phase titanium silicide. In general, a rapid thermal annealing process can be used to transform the high-resistance, $C_{49}$ phase titanium silicide into low-resistance, $C_{54}$ phase titanium silicide. However, as the line width of VLSI circuit drops to 0.25 μm or lower, a higher temperature is required to grow the $C_{54}$ phase titanium silicide due to what is known as the narrow size effect. The narrow size effect is a relationship showing the effect of line width on the phase transformation temperature of titanium silicide. The smaller the line width of the integrated circuit is, the higher the phase transformation temperature for transforming high-resistance, $C_{49}$ phase titanium silicide into low-resistance, $C_{54}$ phase titanium silicide. If a higher temperature is used in a RTP process so that more $C_{54}$ phase titanium silicide is formed, the properties of the resultant titanium silicide layer are highly unstable, such as formation of titanium silicide on a side-wall of the gate electrode due to a lateral growth effect. The lateral growth effect may cause a bridge to form between the gate electrode and the source/drain regions.

A conventional salicide method forming cobalt silicide is provided for resolving the narrow size effect. Cobalt atoms can diffuse into polysilicon and react with the polysilicon without the narrow size effect. However, cobalt reacting with silicon at the source/drain regions causes junction leakage.

SUMMARY OF THE INVENTION

The invention provides a self-aligned silicide process. A substrate at least comprising a transistor thereon is provided. The transistor comprises a gate on the substrate, a spacer on the sidewall of the gate, and source/drain region within the substrate beside the gate. A thin metal layer is formed over the substrate by CVD or PVD. A first rapid thermal process is performed to make the metal layer react with polysilicon of the gate and of the source/drain regions to form a first metal silicide layer. The metal layer, which does not react with polysilicon, is removed. A selective raised salicide process is performed to form a second metal silicide layer on the first metal silicide layer using the first metal silicide layer as a nucleation layer. A second rapid thermal process is performed to transfer the first metal silicide layer and the second metal silicide layer from a high-resistance $C_{49}$ phase to a low-resistance $C_{54}$ phase.

The metal layer is thin so that light polysilicon of the gate and of the source/drain regions is consumed while forming the first metal silicide layer. Furthermore, the second metal silicide layer is selectively formed on the first metal silicide layer and does not form on other materials, such as silicon oxide or silicon nitride. Thus, the position where the second metal silicide layer forms is easily controlled. Junction leakage between the source/drain regions and the substrate can be prevented because light polysilicon of the gate and of the source/drain region is consumed. The thickness of the second metal silicide layer can be increased using the method of the invention rather than using a conventional method. Sheet resistance of the gate can thus be decreased.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 1A to 1D are schematic, cross-sectional views showing the steps of one preferred embodiment of the self-aligned silicide process of the invention.

Figure 1A:
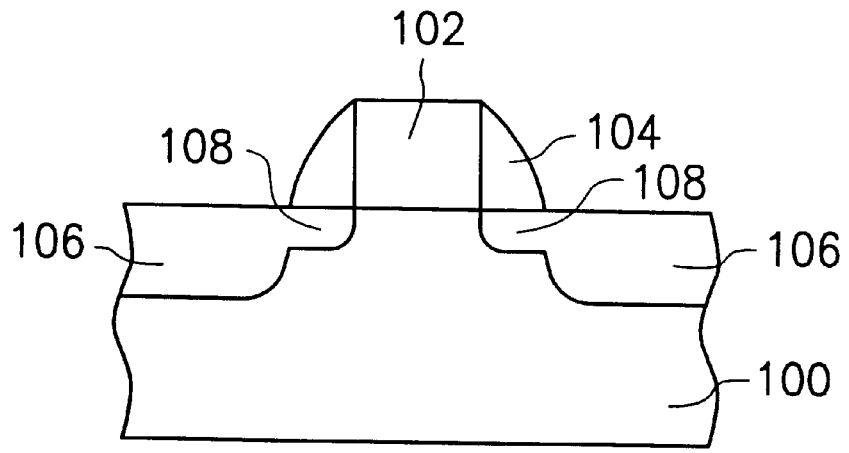
FIGS. 1A to 1D are schematic, cross-sectional views showing the steps of one preferred embodiment of the self-aligned silicide process of the invention.

Referring to FIG. 1A, a semiconductor substrate 100 is provided. A metal oxide semiconductor (MOS) transistor including a polysilicon gate 102, a spacer 104 and source/drain regions 106 is also formed on the semiconductor substrate 100. The spacer is formed on the sidewall of the gate 102. The source/drain regions 106 are formed within the semiconductor substrate 100 beside the gate 102. The source/drain regions 106 may comprise lightly doped drain regions 108.

Figure 1B:
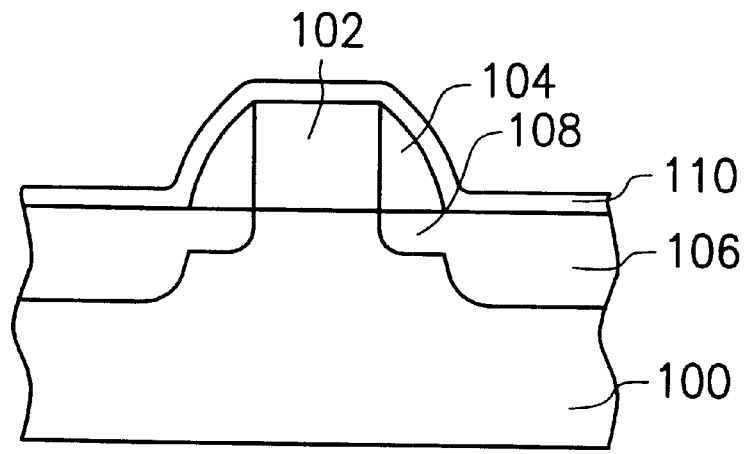

Referring to FIG. 1B, a metal layer 110, such as a titanium layer, is formed over the semiconductor substrate 100. A thickness of the metal layer 110 is about 50–150 Å. Methods used to form the metal layer 110 comprise chemical vapor deposition (CVD) and physical vapor deposition (PVD).

Figure 1C:
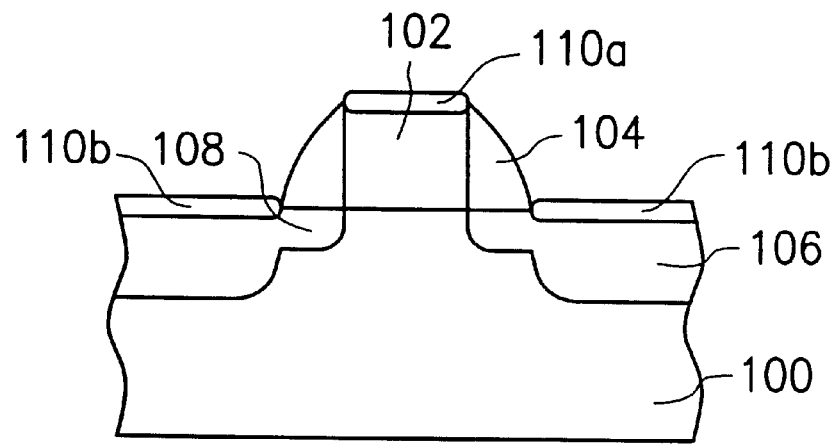

Referring to FIG. 1C, a rapid thermal process (RTP) is performed to make the metal layer 110 react with the polysilicon of the gate 102 and the source/drain regions 106. First metal silicide layers 110a and 110b, such as titanium silicide, are thus formed. The metal layer 110 does not react with other material, such as silicon oxide or silicon nitride, and therefore there is no metal layer to remove from the spacer 104 or other regions of the substrate 100 lacking polysilicon. For example, wet etching process is used to removed the remaining metal layer 110.

Figure 1D:
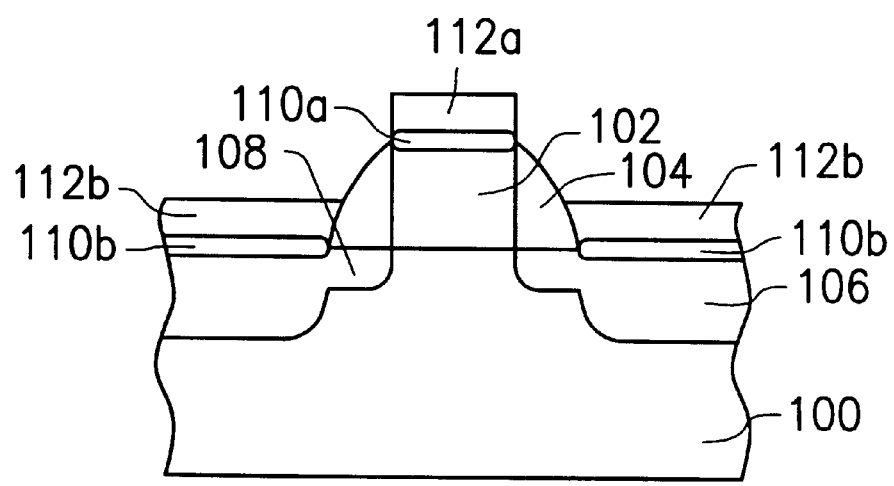

Referring to FIG. 1D, second metal silicide layers 112a and 112b are formed on the first metal layers 110a and 110b. The second metal silicide layers 112a and 112b are formed using selective CVD process so that the second metal silicide material is only formed on silicide material. The first metal silicide layer 110a and 110b are used as nucleation layers while performing the selective CVD process. A material of the second metal silicide layer comprises titanium silicide. A thickness of the second metal silicide layers 112a and 112b is about 300–900 Å.

For example, gas source of the selective CVD comprises silane ($SiH_4$) and titanium chloride ($TiCl_4$). Silane is used to provide the silicon ions for the titanium silicide. Titanium chloride is used to provided titanium ions of titanium silicide. The flow rate of silane is about 3–10 sccm. The flow rate of the titanium chloride is about 3–10 sccm. The selective CVD is performed at a temperature of about 500–700° C. and a pressure of about 3–10 torr. Since the second metal silicide layer 112a and 112b are formed from silane and titanium chloride, polysilicon of the gate 102 and of the source/drain regions 106 is not consumed. The second metal silicide layer 112a and 112b are formed toward the top of the first metal silicide layer 110a and 110b. Thus, the selective CVD process is also called a selective raised CVD process.

The first metal silicide layers 110a, 110b and the second metal silicide layers 112a, 112b have a high-resistance $C_{49}$ phase. A rapid thermal process is performed to transfer metal silicide from the high-resistance $C_{49}$ phase to a low-resistance $C_{54}$ phase. The rapid thermal process is performed at a temperature of about 825–875° C. and at a pressure of about 1–10 torr for about 10–30 seconds.

The selective CVD forms titanium silicide on a first metal silicide layer because the selective titanium silicide is affected by doping density and surface condition of the gate and the source/drain regions while directly forming titanium silicide on the gate or on the source/drain regions. The selectivity and deposition rate for titanium silicide formation using selective CVD may vary. Thus, quality and thickness of titanium silicide are difficult to control.

In the invention, titanium silicide formed using selective CVD is formed on the first metal silicide layers so that the problems due to doping density or surface condition can thus be avoided.

The metal layer is thin (about 50–150 Å) so that the metal layer reacting with the gate and the source/drain regions only consumes light polysilicon of the gate and of the source/drain regions. Junction leakage formed between the source/drain regions and the substrate can thus be prevented. Furthermore, the second metal silicide layer is formed using selective raised CVD with little consuming polysilicon of the gate and the source/drain regions so that a thick second metal silicide layer can be formed to decrease sheet resistance of the gate.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A self-aligned silicide process, comprising the steps of:
   providing a semiconductor substrate comprising a transistor formed thereon, wherein the transistor has a polysilicon gate on the semiconductor substrate, a spacer on the side-wall of the gate, and source/drain regions within the semiconductor substrate beside the gate;
   forming a metal layer over the semiconductor substrate;
   performing a first rapid thermal process to make the metal layer react with the gate and the source/drain regions to form a first metal silicide layer;
   removing a part of the metal layer, which does not react with the gate and the source/drain regions;
   selectively forming a second metal silicide layer on the first metal silicide layer; and
   performing a second rapid thermal process to transform the first metal silicide layer and the second metal silicide layer from a high-resistance phase into a low-resistance phase.

2. The process according to claim 1, wherein methods for forming the metal layer comprise chemical vapor deposition (CVD) and physical vapor deposition (PVD).

3. The process according to claim 1, wherein a material of the metal layer comprises titanium.

4. The process according to claim 1, wherein a thickness of the metal layer is about 50–150 Å.

5. The process according to claim 1, wherein a thickness of the second metal silicide layer is about 300–900 Å.

6. The process according to claim 1, wherein the second metal silicide layer is formed using a selective raised salicide process.

7. The process according to claim 6, wherein titanium chloride ($TiCl_4$) and silane ($SiH_4$) are used as gas sources while performing the selective raised salicide process.

8. The process according to claim 7, wherein a flow rate of titanium chloride is about 3–10 sccm.

9. The process according to claim 7, wherein a flow rate of silane is about 3–10 sccm.

10. The process according to claim 7, wherein the selective raised salicide process is performed at a temperature of about 500–700° C.

11. The process according to claim 1, wherein the second rapid thermal process is performed at a temperature of about 825–875° C.

12. A self-aligned silicide process applying to a semiconductor substrate having a transistor thereon, comprising the steps of:
    forming a metal layer over the transistor;
    performing a first rapid thermal process to form a first metal silicide layer on a gate and source/drain regions of the transistor; and
    selectively forming a second metal silicide layer on the first metal silicide layer.

13. The process according to claim 12, wherein methods for forming the metal layer comprise chemical vapor deposition (CVD) and physical vapor deposition (PVD).

14. The process according to claim 12, wherein a material of the metal layer comprises titanium.

15. The process according to claim 12, wherein a thickness of the metal layer is about 50–150 Å.

16. The process according to claim 12, wherein a thickness of the second metal silicide layer is about 300–900 Å.

17. The process according to claim 12, wherein titanium chloride ($TiCl_4$) and silane ($SiH_4$) are used as gas sources while forming the second metal silicide layer.

18. The process according to claim 12, wherein the second metal silicide layer is formed at a temperature of about 500–700° C.

19. The process according to claim 1, wherein, in the step of selectively forming the second metal silicide layer, the first metal silicide layer functions as a nucleation layer and the second metal silicide layer is formed only on top of the first metal silicide layer.

20. The process according to claim 12, wherein, in the step of selectively forming the second metal silicide layer, the first metal silicide layer functions as a nucleation layer and the second metal silicide layer is formed only on top of the first metal silicide layer.

* * * * *